(12) United States Patent
Sekiya

(10) Patent No.: US 10,150,198 B2
(45) Date of Patent: Dec. 11, 2018

(54) METHOD FOR INSPECTING CUTTING BLADE

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 291 days.

(21) Appl. No.: 15/077,469

(22) Filed: Mar. 22, 2016

(65) Prior Publication Data

US 2016/0279753 A1    Sep. 29, 2016

(30) Foreign Application Priority Data

Mar. 23, 2015  (JP) ................................ 2015-059572

(51) Int. Cl.
| | | |
|---|---|---|
| B24B 19/02 | (2006.01) | |
| B23Q 17/09 | (2006.01) | |
| B23Q 17/24 | (2006.01) | |
| H01L 21/304 | (2006.01) | |
| H01L 21/78 | (2006.01) | |

(52) U.S. Cl.
CPC .......... B24B 19/02 (2013.01); B23Q 17/0909 (2013.01); B23Q 17/249 (2013.01); B23Q 17/2457 (2013.01); *H01L 21/3043* (2013.01); *H01L 21/78* (2013.01)

(58) Field of Classification Search
None
See application file for complete search history.

(56) References Cited

U.S. PATENT DOCUMENTS

| | | | | |
|---|---|---|---|---|
| 6,633,379 B2 * | 10/2003 | Roesner | ................ | B23Q 17/24 |
| | | | | 356/301 |
| 9,099,547 B2 * | 8/2015 | Martens | .................. | H01L 22/14 |
| 9,627,260 B2 * | 4/2017 | Sekiya | ............... | B23Q 17/0952 |
| 2008/0102542 A1 * | 5/2008 | Negishi | ............. | H01L 21/67092 |
| | | | | 438/16 |

FOREIGN PATENT DOCUMENTS

JP   2009-083016   4/2009

* cited by examiner

*Primary Examiner* — Jill Culler
(74) *Attorney, Agent, or Firm* — Greer Burns & Crain, Ltd.

(57) ABSTRACT

A method of inspecting a cutting blade having a cutting edge formed of abrasive grains of selected abrasive grain diameters which are bound by a bonding material, includes a cutting step of moving the chuck table and the cutting blade, which is being rotated at a high speed, relatively to each other along a direction perpendicular to an axis of rotation of a spindle, thereby forming a cut groove in the workpiece, and an inspecting step of capturing an image of the cut groove formed in the workpiece by image capturing means, and inspecting the state of the cut groove. The inspecting step examines whether or not the selected abrasive grain diameters are proper on the basis of any of the elements representing the size of an average chip, the number of chips, and the area of chips on both sides of the cut groove per unit length.

3 Claims, 7 Drawing Sheets

METHOD FOR INSPECTING CUTTING BLADE

BACKGROUND OF THE INVENTION

Field of the Invention

The present invention relates to a method of inspecting a cutting blade to examine whether or not the abrasive grains on the cutting edge of the cutting blade have proper selected particle diameters.

Description of the Related Art

Cutting apparatus provided with cutting blades are used to divide semiconductor wafers with a plurality of semiconductor devices formed on their surfaces, optical device wafers with optical devices thereon, glass substrates, ceramics substrates, and resin substrates, etc. into individual device chips. The cutting edge of the cutting blade for use on cutting apparatus is formed of abrasive grains of diamond or the like that are bound by plating or a bonding material of metal, resin, or the like. As the cutting blade cuts a workpiece, the cutting edge self-sharpens to enable the abrasive grains to break and cut the workpiece with a certain level of sharpness.

Since chipping correlates with the abrasive grain diameter, a cutting blade having abrasive grains whose average particle diameters are smaller than a predetermined size is selected in order to cut a workpiece with chips kept below a predetermined size. Inasmuch as the types of cutting blades are classified according to abrasive grain diameters and bonding materials, a cutting blade is selected on the basis of the results of machining processes which are determined using a number of cutting blade types. Cutting blades whose types are divided according to abrasive grain diameters on the order of μm make it impossible to tell the difference between their abrasive grain diameters by appearance. For this reason, it is customary for the operator to confirm the type of a cutting blade using as a clue a mark or the like that its manufacturer has applied to the cutting blade, and install the confirmed cutting blade on the spindle (see, for example, Japanese Patent Laid-Open No. 2009-83016).

SUMMARY OF THE INVENTION

However, in the event that the manufacturer of a cutting blade has accidentally applied a mark which is inconsistent with the abrasive grain diameters of the cutting blade, or due to an oversight on the part of the operator, the operator may install a cutting blade of a different type on the cutting apparatus by mistake. If a workpiece is cut by such a cutting blade whose type is different from the cutting blade that should normally be used on the workpiece, then since the size of chips is different, the cutting blade installation error may be discovered at the time of a kerf check.

The difference between a cutting blade whose average abrasive grain diameter is about 2 μm and a cutting blade whose average abrasive grain diameter is about 4 μm, for example, cannot quickly be recognized by the operator unless the operator is highly skilled because the difference causes only slightly larger (or smaller) chips as a whole. If a large number of workpieces are cut by a cutting blade whose abrasive grain diameters are slightly different from the abrasive grain diameters that match the workpieces, then a large number of nonstandard chips are produced, resulting in the production of many device chips that cannot be put on the market.

It is therefore an object of the present invention to provide a method of inspecting a cutting blade to be able to detect a cutting blade whose average abrasive grain diameter is slightly different from the average abrasive grain diameter of a cutting blade that is used as a reference.

In accordance with an aspect of the present invention, there is provided a method of inspecting a cutting blade having a cutting edge formed of abrasive grains of selected abrasive grain diameters which are bound by a bonding material, the method including a holding step of holding a workpiece on a chuck table, an installing step of installing the cutting blade on a tip end of a spindle having an axis of rotation along a first direction, a cutting step of moving the chuck table and the cutting blade, which is being rotated at a high speed, relatively to each other along a second direction perpendicular to the first direction, thereby forming a cut groove in the workpiece, and an inspecting step of capturing an image of the cut groove formed in the workpiece by image capturing means, and inspecting the state of the cut groove. The inspecting step examines whether or not the selected abrasive grain diameters are proper on the basis of any of the elements representing the size of an average chip, the number of chips, and the area of chips on both sides of the cut groove per unit length.

Preferably, the method further includes a basic data generating step of generating basic data based on any one of the elements representing the size of an average chip, the number of chips, and the area of chips on both sides of the cut groove per unit length, which has been formed in the workpiece by the cutting blade having the cutting edge formed of the abrasive grains of the selected abrasive grain diameters, and whose state has been inspected. The inspecting step examines whether or not the selected abrasive grain diameters are proper by comparing the state of the cut groove formed by the cutting step and the basic data with each other.

Preferably, the cutting edge of the cutting blade includes an electroformed grinding stone formed of abrasive grains of diamond bound by nickel plating as a bonding material.

In the method of inspecting a cutting blade according to the present invention, since the state of the cut groove is inspected on the basis of any of the elements representing the size of an average chip, the number of chips, and the area of chips on both sides of the cut groove per unit length, even if a cutting blade whose abrasive grain diameters are slightly different from those of a cutting blade as a reference is used, the difference between those cutting blades can be detected.

Furthermore, it has heretofore been customary to set a threshold value for a maximum chip size and monitor chips caused by a cutting blade periodically according to the threshold value. If the threshold value for the maximum chip size is reduced, then the cutting apparatus may tend to suffer a problem (error) and a shutdown even under those conditions in which cutting blades have been accessed as acceptable thus far, and it requires a wasteful long time for machining because of the need of a man-hour for cancelling the shutdown. The method of inspecting a cutting blade according to the present invention is free of such a problem.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
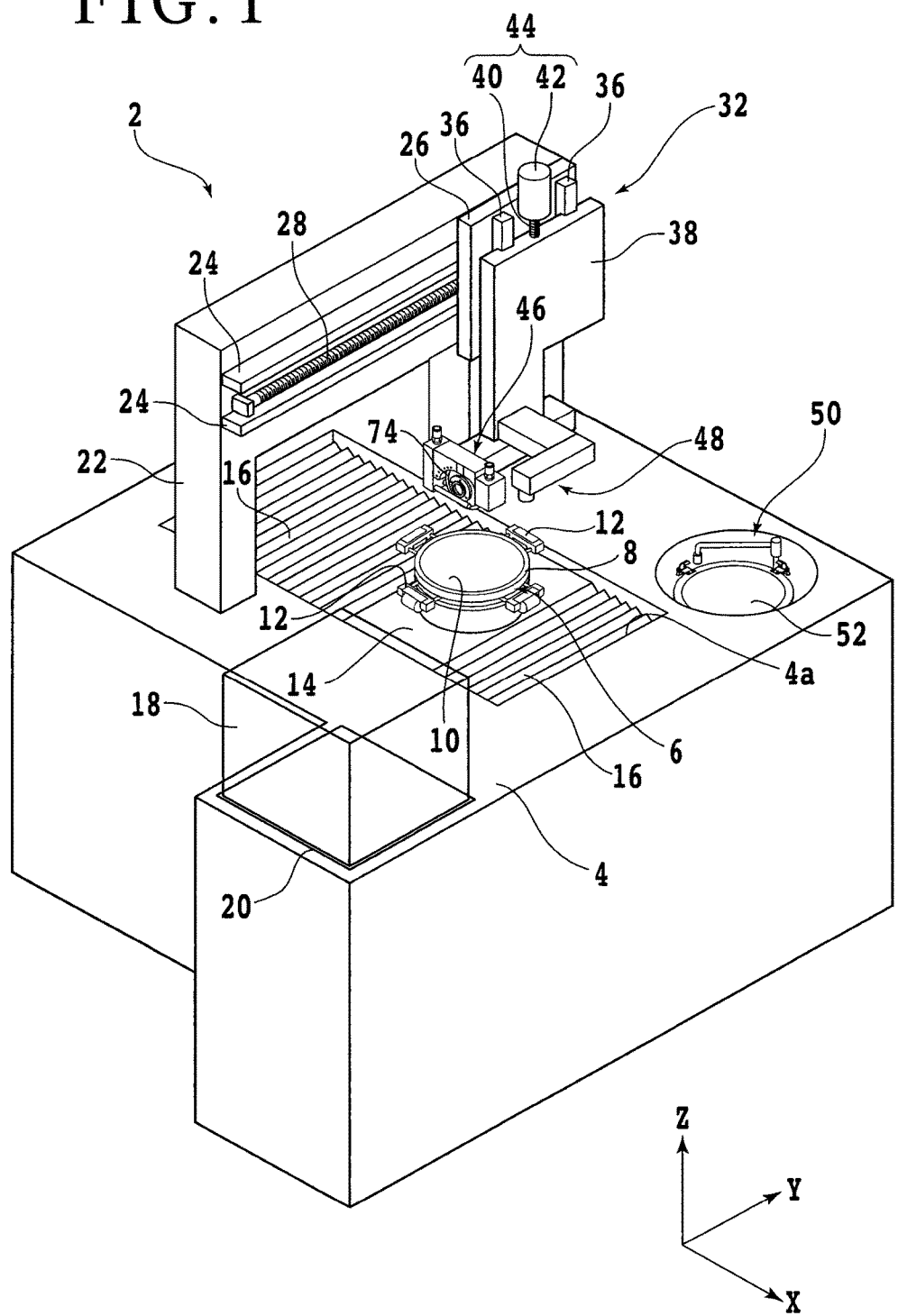
FIG. 1 is a perspective view of a cutting apparatus suitable for carrying out a method of inspecting a cutting blade according to the present invention.

A method of inspecting a cutting blade according to an embodiment of the present invention will be described in detail below with reference to the accompanying drawings. FIG. 1 shows in perspective a cutting apparatus 2 suitable for carrying out a method of inspecting a cutting blade according to the present invention. As shown in FIG. 1, the cutting apparatus 2 includes a base 4 with a recess 4a defined therein and a chuck table 6 disposed in the recess 4a and movable back and forth along an X-axis direction by a machining feed mechanism, not shown.

The chuck table 6 has a frame 8 made of metal such as SUS or the like and a suction holder 10 made of porous ceramics or the like disposed in the frame 8. A plurality of clamps 12 and a water cover 14 are disposed around the chuck table 6, and corrugated panels 16 extend between and are joined to the water cover 14 and the base 4.

Figure 2:
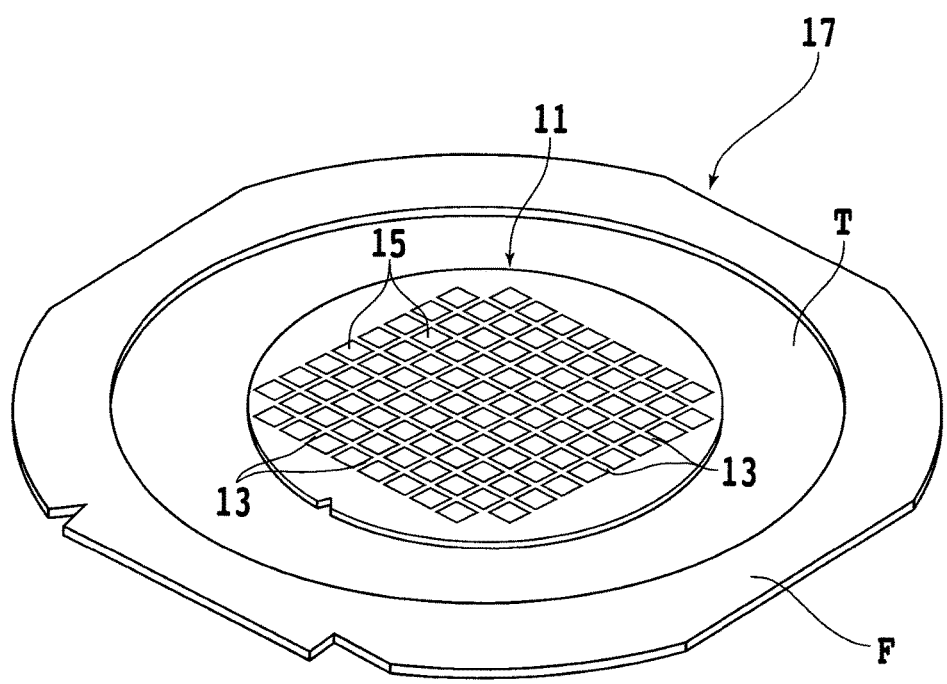
FIG. 2 is a perspective view of a wafer unit.

FIG. 2 shows a wafer unit 17 in perspective. The wafer unit 17 includes a dicing tape T having an outer circumferential edge adhered to an annular frame F and a semiconductor wafer (hereinafter also referred to as wafer) 11 whose reverse side is adhered to the dicing tape T. Devices 15 such as ICs, LSI circuits, etc. are formed in respective areas on the surface of the wafer 11 which are separated by a plurality of projected dicing lines 13.

The wafer unit 17 shown in FIG. 2 includes the semiconductor wafer 11 as a workpiece to be cut. However, the workpiece is not limited to the semiconductor wafer 11, but may be a planar workpiece which may be any of other wafers including an optical device wafer with a plurality of optical devices formed on its surface, a ceramics substrate, and a resin substrate, etc.

Referring back to FIG. 1, a plurality of wafer units 17 are housed in a cassette 18 that is placed in a vertically movable cassette elevator 20. A portal-shaped column 22 is erected on a rear portion of the base 4. A pair of guide rails 24 extending along a Y-axis direction which are perpendicular to the X-axis direction are fixed to the column 22. A Y-axis movable block 26 is mounted on the column 22 and guided by the guide rails 24 for movement along the Y-axis direction by a Y-axis moving mechanism 32 which includes a ball screw 28 and a pulse motor, not shown.

A pair of guide rails 36 extending along a Z-axis direction which are perpendicular to the X- and Y-axis directions are fixed to the Y-axis movable block 26. On the Y-axis movable block 26, there is mounted an Z-axis movable block 38 guided by the guide rails 36 for movement along the Z-axis direction by a Z-axis moving mechanism 44 which includes a ball screw 40 and a pulse motor 42. A cutting unit 46 and an image capturing unit 48 are mounted on the Z-axis movable block 38. The image capturing unit (imaging unit) 48 includes a microscope and an image capturing device such as a CCD or the like. Images captured by the image capturing unit 48 are displayed on a display monitor, not shown.

A spinner cleaning unit 50 having a spinner table 52 is mounted in the base 4. A wafer 11 which is held on the chuck table 6 and has been cut by the cutting unit 46 is fed to the spinner table 52 of the spinner cleaning unit 50 by a feed unit, not shown, and spin-cleaned and spin-dried while being held on the spinner table 52.

Figure 3:
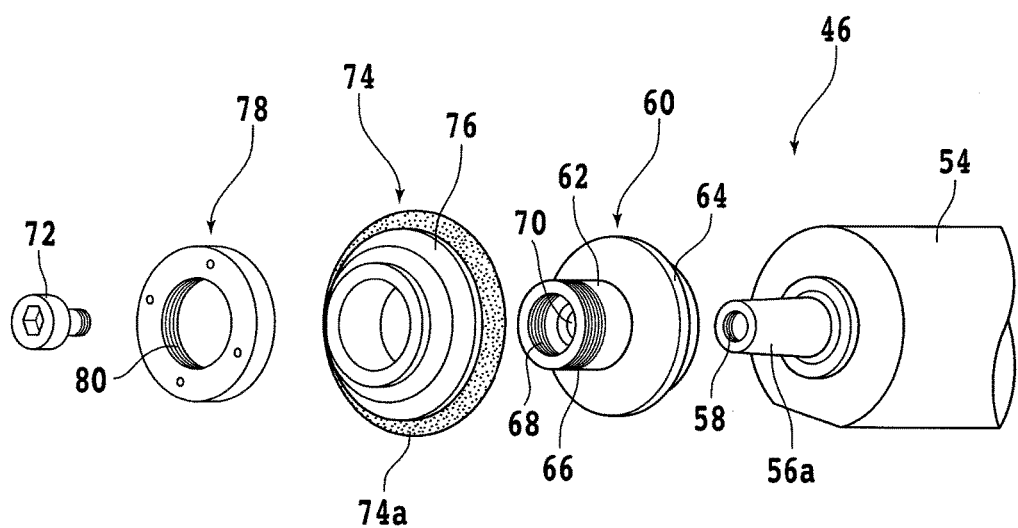
FIG. 3 is an exploded perspective view illustrating a cutting blade installing step.

As shown in FIG. 3, the cutting unit 46 includes a spindle 56 rotatably housed in a spindle housing 54 and having a distal end portion 56a projecting from the spindle housing 54 and tapered toward its tip end. The distal end portion 56a of the spindle 56 has a threaded hole 58 defined in its end face.

A blade mount 60 includes a hollow cylindrical boss 62 and a flange 64 integrally formed with the hollow cylindrical boss 62. The hollow cylindrical boss 62 has an external thread 66 formed on an outer circumferential surface thereof and an internal thread 68 formed on an inner circumferential surface thereof. The blade mount 60 also has a tapered engagement hole 70 defined therein which is complementary in shape to the distal end portion 56a of the spindle 56.

The blade mount 60 is installed on the tapered distal end portion 56a of the spindle 56 by inserting the tapered engagement hole 70 in the blade mount 60 into the tapered distal end portion 56a, threading a screw 72 through the tapered engagement hole 70 into the threaded hole 58, and tightening the screw 72.

A cutting blade 74 includes a hub blade having a cutting edge (electroformed grinding stone) 74a electroformed by nickel plating on the outer circumferential surface of a circular base 76 that is made of aluminum alloy. A fastening nut 78 has an internal thread 80 formed on an inner circumferential surface thereof for threaded engagement with the external thread 66 on the hollow cylindrical boss 62 of the blade mount 60.

For installing the cutting blade 74 on the spindle 56, the cutting blade 74 is fitted over the hollow cylindrical boss 62 of the blade mount 60, and the internal thread 80 on the fastening nut 78 is threaded onto the external thread 66 on the hollow cylindrical boss 62 and tightened thereon. The cutting blade 74 is now installed in place by being sandwiched between the flange 64 of the blade mount 60 and the fastening nut 78.

When the operator of the cutting apparatus 2 is to install the cutting blade 74 on the blade mount 60, the operator confirms the type of the cutting blade using as a clue a mark or the like that its manufacturer has applied to the cutting blade 74, and then the operator installs the confirmed cutting blade 74 on the blade mount 60. However, in the event that the manufacturer of the cutting blade 74 has accidentally applied a mark which is inconsistent with the abrasive grain diameter of the cutting blade 74, or due to an oversight on the part of the operator, the operator may install a cutting blade of a different type on the cutting apparatus 2 by mistake. The method of inspecting a cutting blade according to the present embodiment is effective to discover such a mistake at an early stage.

Figure 4:
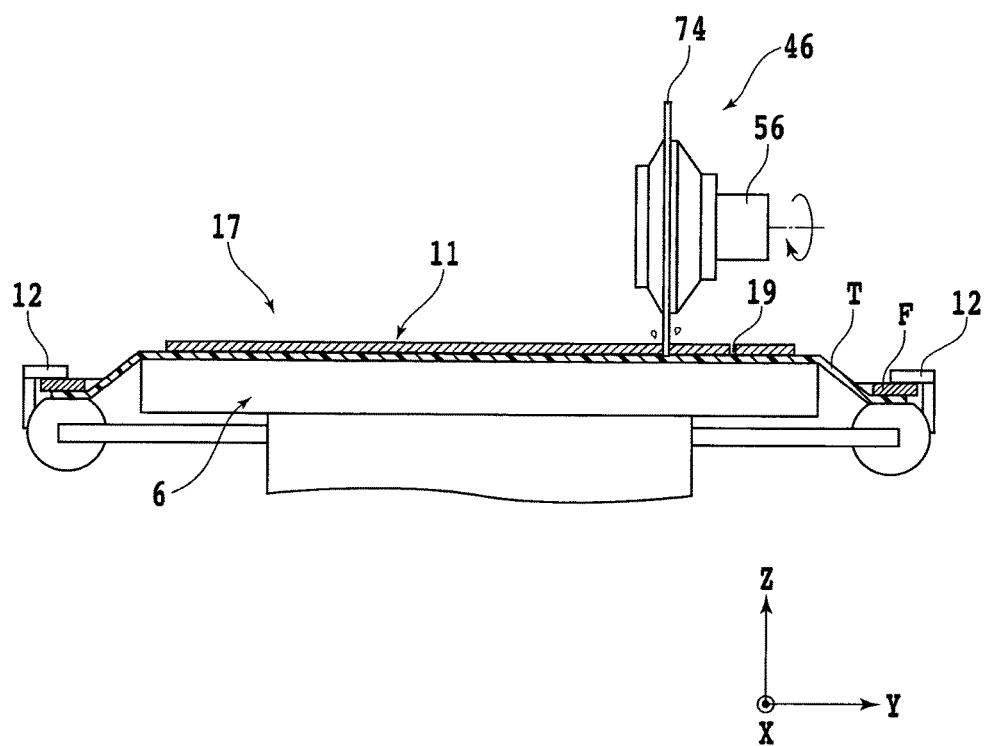
FIG. 4 is a side elevational view, partly in cross section, illustrating a cutting step.

The method of inspecting a cutting blade according to the present embodiment will be described in detail below with reference to FIGS. 4 through 6B. First, as shown in FIG. 4, a holding step is carried out to hold the wafer 11 of the wafer unit 17 on the chuck table 6 of the cutting apparatus 2. The annular frame F of the wafer unit 17 is clamped securely in place by the clamps 12. Then, a cutting step is carried out to form a cut groove 19 in the wafer 11 along a projected dicing line 13 by causing the cutting blade 74 to cut into the wafer 11 to the depth reaching the dicing tape T along a projected dicing line 13 which extends along a first direction while rotating the spindle 56 whose axis of rotation extends along the Y-axis direction at a high speed (e.g., 30000 rpm), and feeding the chuck table 6 along the X-axis direction perpendicular to the Y-axis direction.

Then, the cutting unit 46 is indexed, i.e., fed, by the pitch between the projected dicing lines 13 along the Y-axis direction, and thereafter the cutting blade 74 is caused to cut into the wafer 11 to form a cut groove 19 along a next projected dicing line 13. In this manner, cut grooves 19 are formed along all the projected dicing lines 13 extending along the first direction. Then, the chuck table 6 is turned 90 degrees, and cut grooves 19 are formed along all the projected dicing lines 13 extending along a second direction that extends perpendicularly to the first direction. After the cut grooves 19 have been formed in the wafer 11 along all the projected dicing lines 13 thereon, the wafer 11 is divided into individual device chips.

Figure 5:
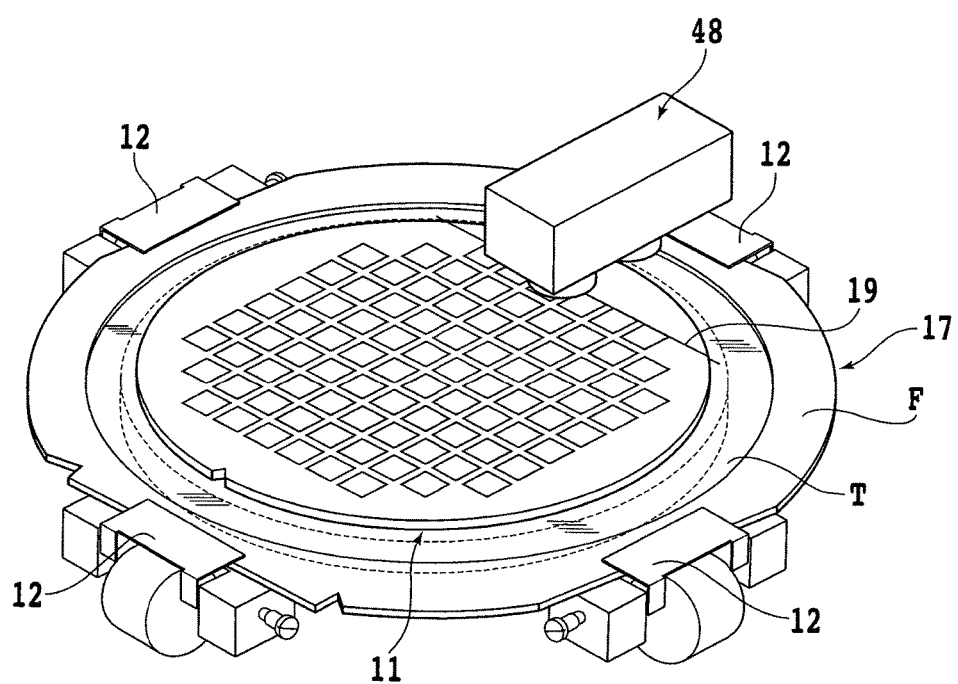
FIG. 5 is a perspective view illustrating an inspecting step.

In the method of inspecting a cutting blade according to the present embodiment, an inspecting step is carried out to inspect the state of the cut groove 19 while in the cutting step by capturing an image of a cut groove 19 formed in the wafer 11 with the image capturing unit (image capturing means) 48, as shown in FIG. 5. Preferably, the inspecting step is performed in an initial cutting phase of the cutting step where 1st through 10th cut grooves 19 are formed after the cutting unit 46 has started cutting the wafer 11. Alternatively, the inspecting step may be carried out at periodic intervals.

Figure 6A:
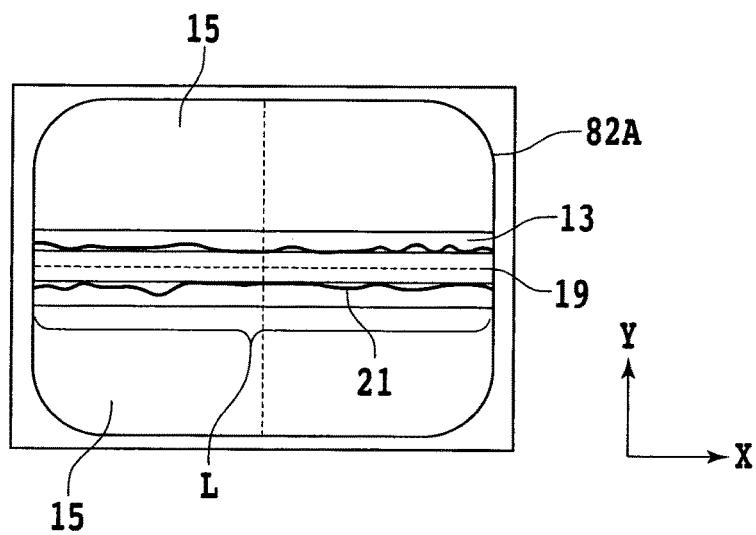
FIG. 6A is a view showing a captured image which represents basic data.
Figure 6B:
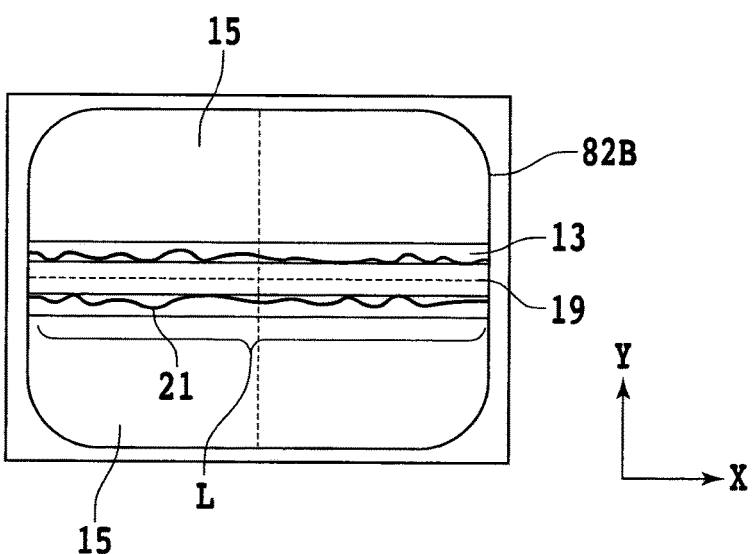
FIG. 6B is a view showing a captured image which represents a cut groove that has been formed.

FIG. 6B shows by way of example an image 82B captured in the inspecting step. The inspecting step inspects the cutting blade 74 to examine whether or not the abrasive grain diameters of the abrasive grains that have been selected for the cutting edge 74a of the cutting blade 74 are proper on the basis of any of the elements representing the size of an average chip, the number of chips, and the area of chips on both sides of the cut groove 19 per unit length L.

The method of inspecting a cutting blade according to the present embodiment preferably includes a basic data generating step to cut the wafer 11 with a cutting blade having a cutting edge made up of abrasive grains having proper abrasive grain diameters, inspect the state of cut grooves 19, and generate basic data in advance on the basis of any of the elements representing the size of an average chip, the number of chips, and the area of chips on both sides of the cut groove 19 per unit length L.

FIG. 6A shows by way of example a captured image 82A of basic data. The inspecting step according to the preferred embodiment examines whether or not the abrasive grain diameters of the selected abrasive grains are proper by comparing the image 82B captured of the cut groove 19 formed in the cutting step as shown in FIG. 6B and the image 82A captured of the cut groove 19 formed in the basic data generating step as shown in FIG. 6A. It is assumed that the inspection results are obtained as shown in Table 1 below.

TABLE 1

| | Maximum size (µm)/ threshold value | Average size (µm)/ threshold value | Count/ threshold value | Area (mm$^2$)/ threshold value | Assessment |
| --- | --- | --- | --- | --- | --- |
| Basic data | 10(12) | 5(6) | 18(20) | 0.3(0.35) | — |
| Sample 1 | 11 | 4 | 15 | 0.32 | ○ |
| Sample 2 | 11 | 8 | 20 | 0.4 | x |

In the inspecting step, sample 1 is assessed as proper because all of the maximum size of chips pieces, the average size of chips, the number of chips, and the area of chips, are smaller than the respective threshold values. In the inspecting step, sample 2 is assessed as improper because the average size of chips and the area of chips are in excess of the threshold values although the maximum size of chips and the number of chips are smaller than the threshold values.

Figure 7:
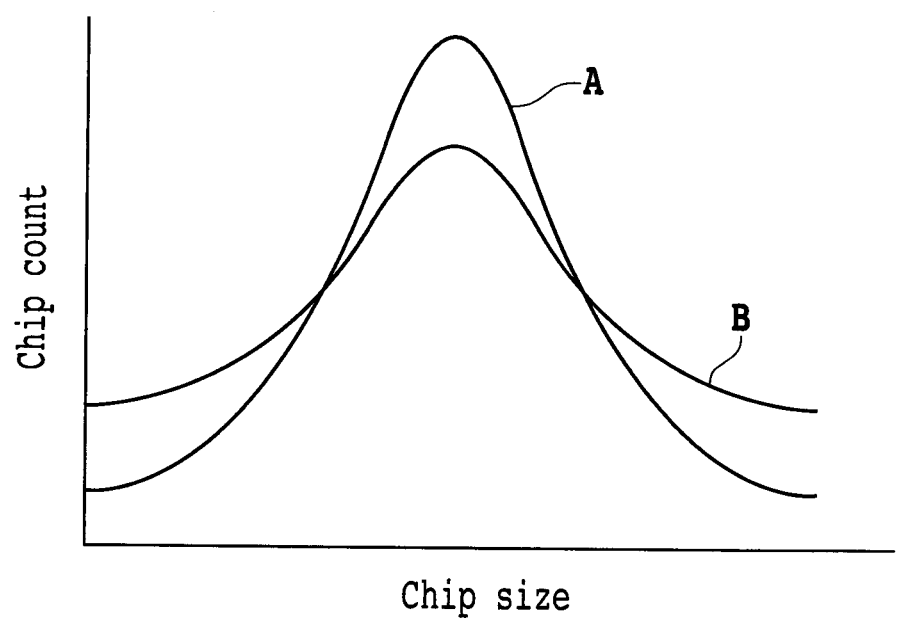
FIG. 7 is a diagram showing the relationship between chip sizes and chip counts for an instance where abrasive grains have proper abrasive grain diameters and an instance where abrasive grains have improper abrasive grain diameters.

In addition, the abrasive grain diameters of selected abrasive grains may be assessed by a statistic process. For example, a distribution of measured chip sizes and chip counts may be determined, and the abrasive grain diameters of selected abrasive grains may be assessed using, as a threshold value, a standard deviation that serves as an assessment reference for proper abrasive grain diameters as indicated by the curve A in FIG. 7. The curve B in FIG. 7 represents a distribution of chip sizes and chip counts for improper abrasive grain diameters. Since the number of large-size chips indicated by the curve B is greater than the number of large-size chips indicated by the curve A which represents proper abrasive grain diameters, the abrasive grain diameters represented by the curve B are assessed as improper.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of inspecting a cutting blade having a cutting edge formed of abrasive grains of selected abrasive grain diameters which are bound by a bonding material, the method comprising:
   a holding step of holding a workpiece on a chuck table;
   an installing step of installing the cutting blade on a tip end of a spindle having an axis of rotation along a first direction;
   a cutting step of moving the chuck table and the cutting blade, which is being rotated at a high speed, relatively to each other along a second direction perpendicular to the first direction, thereby forming a cut groove in the workpiece; and
   an inspecting step of capturing an image of the cut groove formed in the workpiece by image capturing means, and inspecting the state of the cut groove;
   wherein the inspecting step examines whether or not the selected abrasive grain diameters are proper on the basis of at least one of the following: size of an average chip, number of chips, and area of chips on both sides of the cut groove per unit length, from the captured image of the cut groove.

2. The method of inspecting a cutting blade according to claim 1, further comprising:
   a basic data generating step of generating basic data based on at least one of the following: the size of an average chip, the number of chips, and the area of chips on both sides of the cut groove per unit length, which has been formed in the workpiece by the cutting blade having the cutting edge formed of the abrasive grains of the selected abrasive grain diameters, and whose state has been examined during the inspecting step;

wherein the inspecting step examines whether or not the selected abrasive grain diameters are proper by comparing the state of the cut groove formed by the cutting step and the basic data with each other.

3. The method of inspecting a cutting blade according to claim 1, wherein the cutting edge of the cutting blade includes an electroformed grinding stone formed of abrasive grains of diamond bound by nickel plating as a bonding material.

* * * * *